United States Patent [19]

Janes et al.

[11] 4,449,285

[45] May 22, 1984

[54] METHOD FOR PRODUCING A VERTICAL CHANNEL TRANSISTOR

[75] Inventors: Timothy W. Janes, Worcester; John C. White, Malvern, both of England

[73] Assignee: The Secretary of State for Defence in Her Britannic Majesty's Government of the United Kingdom of Great Britain and Northern Ireland, London, England

[21] Appl. No.: 397,342

[22] Filed: Jul. 12, 1982

[30] Foreign Application Priority Data

Aug. 19, 1981 [GB] United Kingdom ................. 8125375

[51] Int. Cl.³ .................. H01L 21/20; H01L 21/285; H01L 21/302
[52] U.S. Cl. ....................................... 29/571; 29/580; 29/584; 29/591; 156/628; 204/192 E; 357/23
[58] Field of Search ...................... 29/571, 576 E, 580, 29/584, 589, 591; 156/628; 357/23 VD; 427/91; 204/192 E

[56] References Cited

U.S. PATENT DOCUMENTS 3,851,379 12/1974 Gutnecht et al. ......... 357/23 VD X

OTHER PUBLICATIONS

Oakes, J. G., et al., "A Power Silicon Microwave MOS Transistor", in *IEEE Transactions on Microwave Theory and Techniques*, vol. MTT-24, No. 6, Jun. 1976, pp. 305-311.

*Primary Examiner*—Brian E. Hearn
*Assistant Examiner*—Alan E. Schiavelli
*Attorney, Agent, or Firm*—Cushman, Darby & Cushman

[57] ABSTRACT

A steep-walled mesa is defined by ion beam, plasma or orientation dependent etch, and has a thick insulating layer over its uppermost surface. The material of the mesa is undercut to leave the insulating layer overhanging. Further insulating material is then formed thinly over the exposed mesa material and conductive material deposited giving good coverage of the insulated sidewalls of the mesa. Excess conductive material is removed by ion-beam milling, leaving a conductive material gate in the shadow of the cap-like insulating layer.

The orientation dependent etchant diazine catalyzed ethylene diaminepyrocatachol-water solution is used to form {111} crystal plane steep side-walled mesa from (110) surface oriented silicon, and aluminium metal conductive material deposited by chemical vapor deposition.

5 Claims, 9 Drawing Figures

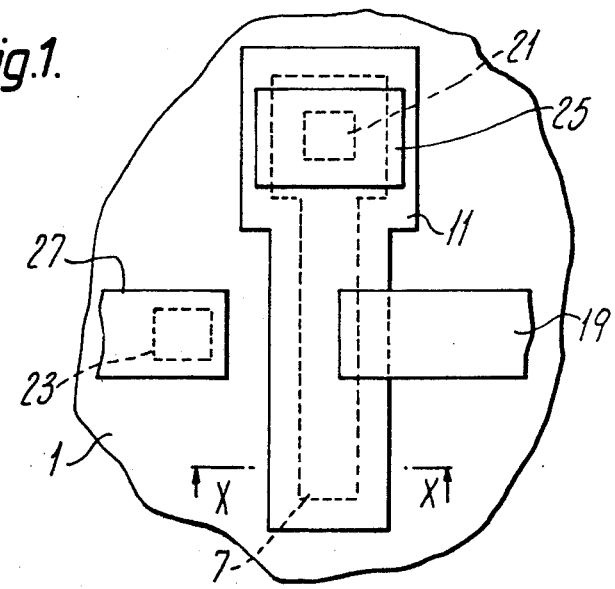
Fig. 1.
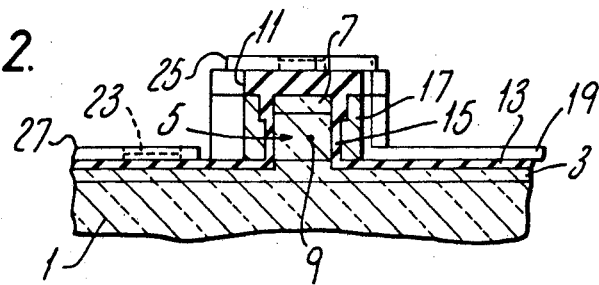
Fig. 2.
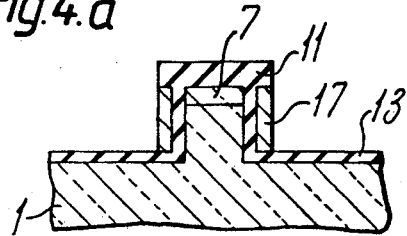
Fig. 4.a
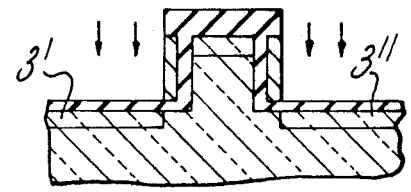
Fig. 4.b

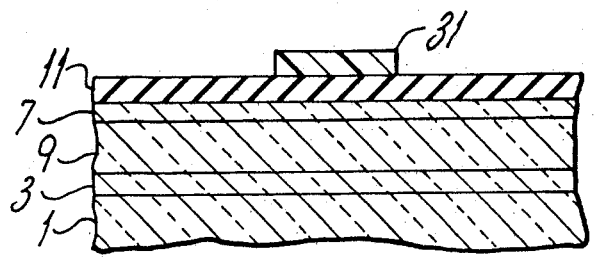
Fig. 3.a
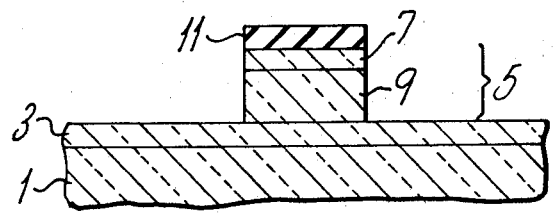
Fig. 3.b
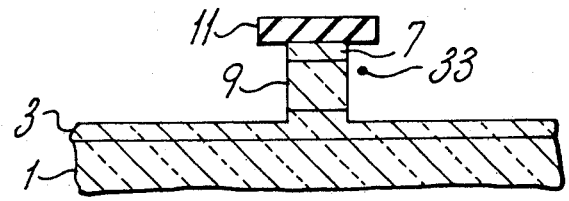
Fig. 3.c
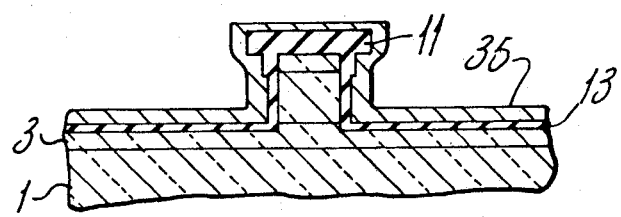
Fig. 3.d
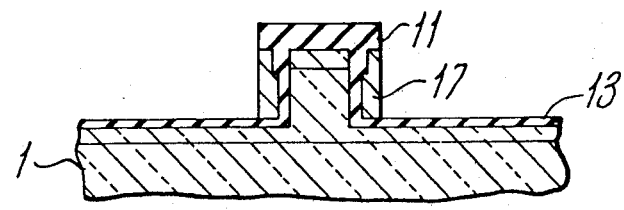
Fig. 3.e

METHOD FOR PRODUCING A VERTICAL CHANNEL TRANSISTOR

TECHNICAL FIELD

The present invention concerns a method for producing a vertical channel transistor.

Vertical channel transistors—i.e. transistors where the source, the gate channel and the drain are stacked vertically above a horizontal supporting semiconductor substrate—are now of interest because of their compactness of structure and the high speed characteristic of their operation.

PRIOR ART

Vertical channel transistors and other non-planar power field effect transistors have been described in a review article by Andre et al, IEEE Transactions on Electron Devices, Vol ED-25 No. 10 October 1978 pp 1222-8. In particular this review article discloses an isotropically etched vertical channel MOS transistor, a self-aligned gate electrode being produced using silicon dioxide overhangs to mask the side of the device structure as the gate electrode material is evaporated obliquely. It is no easy matter aligning the evaporation source to the required accuracy, and furthermore there is the possibility of there being high resistance in the angle-evaporated electrode film.

DISCLOSURE OF THE INVENTION

The present invention is intended to provide an alternative method of production, one intended to obviate the above problems.

In accordance with the invention there is provided a method for producing a vertical channel transistor, the method including the following steps:

providing a semiconductor substrate, and forming a steep-walled mesa of semiconductor material, the mesa having over its upper surface a thick layer of insulating material;

undercutting mesa material beneath the layer of insulating material; forming a thin insulating layer over the mesa side walls and over the substrate material;

depositing conductive material over the insulated mesa and substrate, backfilling thereby the undercut region of the mesa; and, ion beam milling the mesa and substrate to remove excess conductive material, to leave a vertical insulated gate electrode in the undercut region of the mesa.

It is convenient to apply the method to a multi-layer semiconductor substrate—eg a thick oxide layer and alternate layers $n^+$-, p-, $n^+$- on p-type semiconductor material—so that source and drain regions are readily defined.

Alternatively, the doped source region, or the doped drain region, or both, may be introduced at a later stage-for example, after the excess conductive material has been removed. In this latter example the dopant species can be introduced by a self-aligned implant through the thin insulator layer. Though in this example the method is more complex, it has the advantage that electrode overlap with the doped region is avoided and the interelectrode capacitance minimised.

The steep-walled mesa may be formed by ion beam milling, by reactive ion (plasma) etching, or by orientation dependent etching. The undercutting may be produced by a carefully controlled isotropic wet etch.

Where a multi-layer semiconductor substrate is provided, it is convenient to use a fast orientation dependent etchant and to halt the etch process automatically at the appropriate layer-layer interface using electrical bias. This allows close control over etched depth. This is then followed by a slow undercut etch.

BRIEF DESCRIPTION OF THE DRAWINGS

Embodiments of the invention will now be described, by way of example only, with reference to the accompanying drawings in which:

FIG. 1: is a plan-view of a vertical channel transistor produced by a method in accordance with this invention;

FIG. 2: is a cross-section of this transistor viewed from the plane x—x shown in FIG. 1;

FIGS. 3(a) to (e): illustrate by simplified cross-section, various stages in the production of the transistor shown in the preceding figures; and, FIGS. 4(a) and (b): illustrate by simplified cross-section, alternative stages in the production of a vertical channel transistor.

DESCRIPTION OF EMBODIMENTS OF THE INVENTION

The vertical channel transistor shown in FIGS. 1 and 2 comprises a horizontal supporting substrate 1 of silicon semiconductor material, principally p-type material. The upper region 3 of this substrate is doped $n^+n$-type and upon this is stacked a mesa 5 of semiconductor material. The upper region 7 of this mesa 5 is doped $n^+$-type, the remaining region 9 being of p-type material. A thick silicon oxide cap 11 extends over the upper surface of the mesa 5, and a thin oxide coating 13 covers the side walls of the mesa 5, forming the gate insulator 15, and covers the upper surface 3 of the substrate 1. Insulated recesses in the side walls of the mesa, formed by overhang of the thick oxide cap 11, are in-filled with aluminium metal which thus forms a continuous gate electrode 17 surrounding the periphery of the mesa 5. To one side of the mesa 5 lies a gate electrode contact 19. This contact 19 is of aluminium metal and overlaps the upper surface of the oxide cap 11. It is co-extensive with the gate electrode 17. Windows in the oxide material—a window 21 in the oxide cap 11, and a window 23 in the oxide coating 13—provide access to the underlying $n^+$-doped semiconductor regions 7 and 3. Drain and source metal contacts 25 and 27 are formed over these windows 21 and 23.

To produce this vertical channel transistor a p-type single crystal silicon substrate 1 is provided. Epitaxial silicon layers are formed above the surface of the substrate 1, an $n^+$-type layer 3, a p-type layer 9 and uppermost, an $n^+$-type layer 7. The layers are all produced parallel to the (110) crystal plane to provide correct orientation for the orientation dependent anisotropic etch process that follows, as described below. The thickness of the p-type layer 9 is chosen to correspond to that gate length required by design. A thick oxide layer 11 is then grown or deposited on the upper surface of the multi-layered substrate 1 to 7.

To construct the steep-walled mesa structure 5, a photo-resist mask 31 is photolithographically defined on the surface of the oxide layer (FIG. 3(a)).

Excess oxide material is then removed to leave a cap 11 of thick oxide. A diazine catalysed ethylenediamine-pyrocatachol-water solution etchant (see J. Electrochem. Vol. 126 No 8 pp 1406-14) is then used to remove excess semiconductor material to form a mesa 5 having steep side walls. After the excess material of the first n+-type semiconductor layer 7 has been etched away, an electrical bias is then applied so that the etch is automatically halted following removal of excess material from the p-type semiconductor layer 9. Thus all excess material above the layer 9-layer 3 interface is rapidly removed (FIG. 3(b)).

An isotropic wet etchant is then used to remove semiconductor material from the mesa 5, to undercut the thick oxide cap 11 leaving a hollowed recess 33 (FIG. 3(c)).

The structure is then washed, dried and then heated in an oxidising atmosphere to form an insulating coating 13 of oxide over the side walls of the mesa 5 and over the surface of the exposed n+-type layer 3. Windows 21 and 23 are then defined photolithographically and a layer of conductive material—in this example aluminium—is then deposited to cover the oxide 11, 13 and the regions of n+-type material 7, 3 exposed through the windows 21 and 23. The aluminium is deposited by chemical vapor deposition—a process allowing thorough coverage of the structure, particularly the walls of the hollowed recess 33 (FIG. 3(d)).

Once the conductive material has been deposited, the contact areas 19, 25 and 27 for the gate, the drain and the source of the transistor are defined by thick photoresist masks. Excess conductive material is then removed by ion beam milling. Conductive material 17 lying in the recessed periphery 33 of the mesa 5 is shielded by the overhanging oxide cap 11 and is therefore unaffected by the milling process. During this process the contact areas 19, 25 and 27 are shielded by the masks, most of which mask material is consumed during milling (FIG. 3(e)).

As starting structure, the substrate 1 and multi-layers 3, 9 and 7 may include a layer of metallic silicide over the top n+ layer 7 and between this layer 7 and the thick oxide layer 11. Since metallic silicides can be oxidised readily, this oxide layer 11 can be thermally grown. The introduction of this silicide layer has the advantage of reducing the ohmic resistance in the drain to drain contact path.

As an alternative to the method detailed above, either of the doped regions 3, 7 of semiconductor material can be introduced at a later stage of the construction. Thus as shown in FIG. 4(a) the substrate 1 is of p-type material and only one doped region—the drain region 7—is preformed. The mesa structure 5 is formed as already described by orientation dependent etching, or by ion-beam milling, followed by isotropic etch, oxidisation, aluminium vapour deposition and milling. The shaped mesa 5 then masks the substrate 1 as dopant species is implanted through the oxide coating 13 (FIG. 4(b)). The doped regions 3', 3" thus formed are then annealed. Since, however, as in the previous example, the electrode material is aluminium, this anneal must be done carefully—eg it must be a low temperature anneal, fast thermal anneal or laser anneal or similar process—to avoid destruction of the electrode metal. However, alternative gate materials can be used—other metals, metallic silicides, poly-silicon etc. Where refractory material—eg molybdenum—is adopted, higher anneal temperatures may then be used. The regions 3' and 3" may be electrically separate, and the gate electrode 17 divided into isolated portions at points on the periphery of the mesa 5. Two transistors sharing a common drain and drain electrode may thus be formed. A contact or contacts to the regions 3' and 3" are provided by extra steps of construction.

The insulating cap 11 is typically $0.3\mu$ thick, thick enough to overhang the mesa 5 without breaking during the subsequent processing. The insulating layer 15 formed later may be thin—eg only $0.05\mu$ thick, thick enough to provide effective isolation between the mesa material and the conductive material forming the gate 17.

Having described the invention and the manner by which it may be performed, we claim:

1. A method for producing a vertical channel transistor, the method including the following steps:
providing a semiconductor substrate, and forming a steep-walled mesa of semiconductor material, the mesa having over its upper surface a thick layer of insulating material;
undercutting mesa material beneath the layer of insulating material;
forming a thin insulating layer over the mesa side walls and over the substrate material;
depositing conductive material over the insulated mesa and substrate, backfilling thereby the undercut region of the mesa; and
ion beam milling the mesa and substrate to remove excess conductive material, to leave a vertical insulated gate electrode in the undercut region of the mesa.

2. A method as claimed in claim 1 wherein the substrate provided is of single crystal semiconductor material, and the step of forming the steep-walled mesa is performed by:
growing, on a crystal plane face of the substrate, a succession of epitaxial layers of like semiconductor material, alternate layers each being of different carrier type;
forming on the uppermost epitaxial layer, a thick layer of insulating material;
using an orientation dependent etchant to define the steep side-walls of the mesa.

3. A method, as claimed in claim 2, wherein the substrate and the epitaxial layers are of silicon semiconductor material, the epitaxial layers are grown on (110) crystal plane face of the substrate, and the etchant used is a diazine catalysed ethylenediamine-pyrocatachol-water solution etchant.

4. A method as claimed in claim 2 wherein electrical bias is applied across an interface between materials of different carrier type, and the etching of the semiconductor material is halted at this interface.

5. A method is claimed in claim 1 wherein the conductive material is aluminium metal, and the step of depositing this material is performed by chemical vapour deposition.

* * * * *